(12) United States Patent
Wu et al.

(10) Patent No.: US 12,206,408 B2
(45) Date of Patent: Jan. 21, 2025

(54) LEVEL SHIFT CIRCUIT, CHIP AND DISPLAY DEVICE

(71) Applicants: Beijing ESWIN Computing Technology Co., Ltd., Beijing (CN); Hefei ESWIN Computing Technology Co., Ltd., Anhui (CN)

(72) Inventors: Jiajhang Wu, Beijing (CN); Sangmin Park, Beijing (CN); Minsung Kim, Beijing (CN)

(73) Assignees: BEIJING ESWIN COMPUTING TECHNOLOGY CO., LTD., Beijing (CN); HEFEI ESWIN COMPUTING TECHNOLOGY CO., LTD., Anhui (CN)

( * ) Notice: Subject to any disclaimer, the term of this patent is extended or adjusted under 35 U.S.C. 154(b) by 124 days.

(21) Appl. No.: 18/147,500

(22) Filed: Dec. 28, 2022

(65) Prior Publication Data
US 2023/0231557 A1    Jul. 20, 2023

(30) Foreign Application Priority Data
Jan. 17, 2022    (CN) .......................... 202210050579.7

(51) Int. Cl.
*H03K 19/003*    (2006.01)
*G09G 3/36*    (2006.01)
*H03K 19/0185*    (2006.01)

(52) U.S. Cl.
CPC ......... *H03K 19/00315* (2013.01); *G09G 3/36* (2013.01); *H03K 19/018521* (2013.01);
(Continued)

(58) Field of Classification Search
None
See application file for complete search history.

(56) References Cited

U.S. PATENT DOCUMENTS 5,821,800 A  * 10/1998  Le ........................ H03K 17/102
                                                    327/437
9,755,621 B1 *  9/2017  Sinha ............... H03K 3/356113
(Continued)

FOREIGN PATENT DOCUMENTS

CN    207835431 U    9/2018
CN    109391258 A    2/2019
(Continued)

OTHER PUBLICATIONS

Search Report dated Nov. 1, 2022 from the Office Action for Chinese Application No. 202210050579.7 issued Nov. 9, 2022, pp. 1-3.

*Primary Examiner* — Anh Q Tran
(74) *Attorney, Agent, or Firm* — Ladas & Parry, LLP (57) ABSTRACT

Embodiments of the disclosure provide a level shift circuit, a chip and a display device. By setting first and second voltage clamping modules, and by adjusting first clamping voltage by controlling bias voltage input to the first voltage clamping module and adjusting second clamping voltage by controlling bias voltage and second bias voltage input to the second voltage clamping module, respective operating and output voltages of the first and the second voltage clamping modules and the shift module are within small range. Therefore, even the level shift circuit is designed by using devices with breakdown voltage lower than the difference between the first and second power supply voltages, the devices in the level shift circuit may be avoid being breakdown. Accordingly, some process platforms that cannot produce high-breakdown voltage devices may produce chips including the level shift circuit in the embodiment, and the restrictions on the process platform are reduced.

18 Claims, 7 Drawing Sheets

(52) U.S. Cl.
CPC ............... *G09G 2300/0823* (2013.01); *G09G 2310/0289* (2013.01); *G09G 2310/08* (2013.01); *G09G 2330/021* (2013.01)

(56) References Cited

U.S. PATENT DOCUMENTS

| | | | |
|---|---|---|---|
| 10,686,444 B1* | 6/2020 | Chen | ................ H03K 19/00315 |
| 11,641,192 B2* | 5/2023 | Lu | .................. H03K 19/018521 |
| | | | 327/333 |
| 2011/0181341 A1 | 7/2011 | Ishibashi et al. | |
| 2012/0268188 A1* | 10/2012 | Po | .................... H03K 3/356182 |
| | | | 327/333 |
| 2015/0380400 A1 | 12/2015 | Jonishi | |
| 2019/0097614 A1 | 3/2019 | Hwang | |

FOREIGN PATENT DOCUMENTS

| | | |
|---|---|---|
| CN | 109672439 A | 4/2019 |
| CN | 111988029 A | 11/2020 |
| EP | 1130779 A2 | 9/2001 |
| IN | 110890885 A | 3/2020 |
| IN | 111245428 A | 6/2020 |
| WO | 2011064917 A1 | 6/2011 |
| WO | 2015001926 A1 | 1/2015 |
| WO | 2017041691 A1 | 3/2017 |

\* cited by examiner

LEVEL SHIFT CIRCUIT, CHIP AND DISPLAY DEVICE

CROSS TO REFERENCE TO RELATED APPLICATIONS

This application claims benefit of priority to Chinese Patent Application No. 202210050579.7 filed on Jan. 17, 2022, the disclosures of which are incorporated herein by reference in their entireties.

TECHNICAL FIELD

The present disclosure relates to the technical field of electronic circuits, and in particular, to a level shift circuit, a chip and a display device.

BACKGROUND

In order to meet the requirements of display, the existing driver chips usually have multiple voltages. Specifically, in the TFT LCD displays, at least three or more voltages are used according to the external system environment. For example, in a system based on zero VCOM, there is a low voltage/positive high voltage/negative high voltage.

In the traditional design and execution process, full-voltage breakdown elements are mostly used, so the circuit design may have a high degree of freedom. For example, breakdown-voltage elements of 15V are used to design system environments of positive 6V and negative 6V, without reliability problems when designing a level shift circuit. However, at present, some process platforms may produce only medium-voltage breakdown elements (e.g., 8V), which has a certain reliability problem for system environments where the maximum voltage difference exceeds 12V.

Therefore, how to use medium-voltage breakdown elements to design a level shift circuit will become a problem that circuit designers need to solve.

SUMMARY

In a first aspect, an embodiment of the present disclosure provides a level shift circuit, including:

a first voltage clamping module configured to generate a first clamping voltage according to an input signal and a first power supply voltage and adjust the first clamping voltage according to a bias voltage so that the adjusted first clamping voltage is in a first range, an absolute value of a difference between the maximum value and the minimum value of the first range being $\Delta U1$;

a second voltage clamping module configured to adjust the adjusted first clamping voltage according to a first bias voltage and a second bias voltage to obtain a second clamping voltage, the second clamping voltage being in a second range, an absolute value of a difference between the maximum value and the minimum value of the second range being $\Delta U2$; and a shift module configured to generate an output signal according to a second power supply voltage and the second clamping voltage, a voltage of the output signal being in a third range, and an absolute value of a difference between the maximum value and the minimum value of the third range being $\Delta U3$, an absolute value of a difference between the first power supply voltage and the second power supply voltage being $\Delta U$;

wherein, each of the first range, the second range and the third range is between the first power supply voltage and the second power supply voltage, and $\Delta U1 \leq \frac{1}{2}\Delta U$, $\Delta U2 \leq \frac{1}{2}\Delta U$, $\Delta U3 \leq \frac{1}{2}\Delta U$.

Optionally, positive and negative polarities of the first power supply voltage and the second power supply voltage are opposite, and an absolute value of a difference between the first power supply voltage and a reference voltage is equal to an absolute value of a difference between the second power supply voltage and the reference voltage; and the input signal comprises a first input signal and a second input signal each of which is a pulse signal, the first input signal and the second input signal are inverted, and an amplitude of the first input signal is less than or equal to the absolute value of the difference between the first power supply voltage and the reference voltage.

Optionally, the first voltage clamping module comprises a first P-type MOS transistor, a second P-type MOS transistor, a third P-type MOS transistor and a fourth P-type MOS transistor; each of a source of the first P-type MOS transistor and a source of the second P-type MOS transistor is electrically connected to a first power supply terminal for outputting the first power supply voltage; a gate of the first P-type MOS transistor is electrically connected to a first input terminal, and a gate of the second P-type MOS transistor is electrically connected to a second input terminal, wherein the first input signal is input to the first input terminal and the second input signal is input to the second input terminal; a drain of the first P-type MOS transistor is electrically connected to a source of the third P-type MOS transistor, and a drain of the second P-type MOS transistor is electrically connected to a source of the fourth P-type MOS transistor; each of a gate of the third P-type MOS transistor and a gate of the fourth P-type MOS transistor is electrically connected to a first bias circuit for outputting the bias voltage; and a drain of the third P-type MOS transistor and a drain of the fourth P-type MOS transistor are used to output the adjusted first clamping voltage.

Optionally, the second voltage clamping module comprises a first N-type MOS transistor, a second N-type MOS transistor, a fifth P-type MOS transistor and a sixth P-type MOS transistor; each of a gate of the first N-type MOS transistor and a gate of the second N-type MOS transistor is electrically connected to a first bias voltage terminal of a second bias circuit outputting the first bias voltage, and each of a gate of the fifth P-type MOS transistor and a gate of the sixth P-type MOS transistor is electrically connected to a second bias terminal of the second bias circuit outputting the second bias; a drain of the first N-type MOS transistor is electrically connected to the drain of the third P-type MOS transistor, and a source of the first N-type MOS transistor is electrically connected to a source of the fifth P-type MOS transistor; a drain of the second N-type MOS transistor is electrically connected to the drain of the fourth P-type MOS transistor, and a source of the second N-type MOS transistor is electrically connected to a source of the sixth P-type MOS transistor; and a drain of the fifth P-type MOS transistor and a drain of the sixth P-type MOS transistor are used to output the second clamping voltage.

Optionally, the shift module comprises a first shift unit, a second shift unit, a third N-type MOS transistor and a fourth N-type MOS transistor, and the output signal comprises a first output signal and a second output signal; the first shift unit is respectively electrically connected to the drain of the fifth P-type MOS transistor and a gate of the fourth N-type MOS transistor, and is configured to generate the first output signal according to the received second output signal and the second power supply voltage; and the second shift unit is respectively electrically connected to the drain of the sixth P-type MOS transistor and a gate of the third N-type MOS transistor, and is configured to generate the second output signal according to the received first output signal and the second power supply voltage.

Optionally, the first shift unit comprises a fifth N-type MOS transistor and a sixth N-type MOS transistor, each of a gate and a drain of the fifth N-type MOS transistor is electrically connected to the drain of the fifth P-type MOS transistor, a source of the fifth N-type MOS transistor is respectively electrically connected to a gate and a drain of the sixth N-type MOS transistor, the gate of the sixth N-type MOS transistor is also respectively electrically connected to a first output terminal and a second power supply terminal, and a source of the sixth N-type MOS transistor is also electrically connected to the second power supply terminal.

Optionally, the second shift unit comprises a seventh N-type MOS transistor and an eighth N-type MOS transistor, each of a gate and a drain of the seventh N-type MOS transistor is electrically connected to the drain of the sixth P-type MOS transistor, a source of the seventh N-type MOS transistor is respectively electrically connected to a gate and a drain of the eighth N-type MOS transistor, the gate of the eighth N-type MOS transistor is also respectively electrically connected to a second output terminal and a second power supply terminal, and a source of the eighth N-type MOS transistor is also electrically connected to the second power supply terminal.

Optionally, the first shift unit further comprises a ninth N-type MOS transistor, each of a gate and a drain of the ninth N-type MOS transistor is electrically connected to the source of the fifth N-type MOS transistor, and a source of the ninth N-type MOS transistor is respectively electrically connected to the gate and the drain of the sixth N-type MOS transistor.

Optionally, the second shift unit further comprises a tenth N-type MOS transistor, each of a gate and a drain of the tenth N-type MOS transistor is electrically connected to the source of the seventh N-type MOS transistor, and a source of the tenth N-type MOS transistor is respectively electrically connected to the gate and the drain of the eighth N-type MOS transistor.

In a second aspect, an embodiment of the present disclosure provides a chip, comprising the level shift circuit described above.

In a third aspect, an embodiment of the present disclosure provides a display device, comprising the chip described above.

Additional aspects and advantages of the present disclosure will be given in the following description, some of which will become apparent from the following description or appreciated by a practice of the present disclosure.

BRIEF DESCRIPTION OF THE DRAWINGS

The above and/or additional aspects and advantages of the present disclosure will become apparent and be readily understood from the following description of embodiments with reference to the accompanying drawings, in which.

REFERENCE NUMERALS

1: level shift circuit; 11: first voltage clamping module; 12: second voltage clamping module; 13: shift module; 131: first shift unit; 132: second shift unit;
2: first bias circuit;
3: second bias circuit;
10: chip; 101: substrate;
20: display panel;
PM0: P-type MOS transistor for biasing; PM1: first P-type MOS transistor; PM2: second P-type MOS transistor; PM3: third P-type MOS transistor; PM4: fourth P-type MOS transistor; PM5: fifth P-type MOS transistor; PM6: sixth P-type MOS transistor;
NM0: N-type MOS transistor for biasing; NM1: first N-type MOS transistor; NM2: second N-type MOS transistor; NM3: third N-type MOS transistor; NM4: fourth N-type MOS transistor; NM5: fifth N-type MOS transistor; NM6: sixth N-type MOS transistor; NM7: seventh N-type MOS transistor; NM8: eighth N-type MOS transistor; NM9: ninth N-type MOS transistor; NM10: tenth N-type MOS transistor.

DETAILED DESCRIPTION

Examples of embodiments of the present disclosure will be illustrated below in the drawings throughout which same or similar reference numerals refer to same or similar elements or elements having same or similar functions. Also, detailed descriptions of known technologies will be omitted if they are not necessary for the illustrated features of the present disclosure. The embodiments described with reference to the drawings are illustrative, merely used for explaining the present disclosure and should not be regarded as any limitations thereto.

It may be understood by those skilled in the art that, all terms (including technical and scientific terms) used herein have the same meaning as commonly understood by those of ordinary skill in the art to which the present disclosure belongs, unless otherwise defined. It should also be understood that terms, such as those defined in a general dictionary, should be understood to have meanings consistent with their meanings in the context of the prior art and should not be interpreted in idealistic or overly formal meaning, unless specifically defined as herein.

It should be understood by those of ordinary skill in the art that singular forms "a", "an", "the", and "said" may be intended to include plural forms as well, unless otherwise stated. It should be further understood that terms "include/including" used in this specification specify the presence of the stated features, integers, steps, operations, elements and/or components, but not exclusive of the presence or addition of one or more other features, integers, steps, operations, elements, components, and/or combinations thereof. It should be understood that when a component is referred to as being "connected to" or "coupled to" another component, it may be directly connected or coupled to the other elements or provided with intervening elements therebetween. In addition, "connected to" or "coupled to" as used herein may include wireless connection or coupling. As used herein, term "and/or" includes all or any of one or more associated listed items or all combinations thereof.

In the traditional design and execution process, the full-voltage breakdown elements are mostly used, so the circuit design may have a high degree of freedom. For example, breakdown-voltage elements of 15V are used to design system environments of positive 6V and negative 6V, without reliability problems when designing a level shift circuit. However, at present, some process platforms may produce only medium-voltage breakdown elements (e.g., 8V), which has a certain reliability problem for system environments where the maximum voltage difference exceeds 12V. Therefore, how to use medium-voltage breakdown elements to design a level shift circuit will become a problem that circuit designers need to solve.

The technical solutions of the present disclosure and how to solve the above technical problems by the technical solutions of the present disclosure will be described below by specific embodiments in detail.

Figure 1:
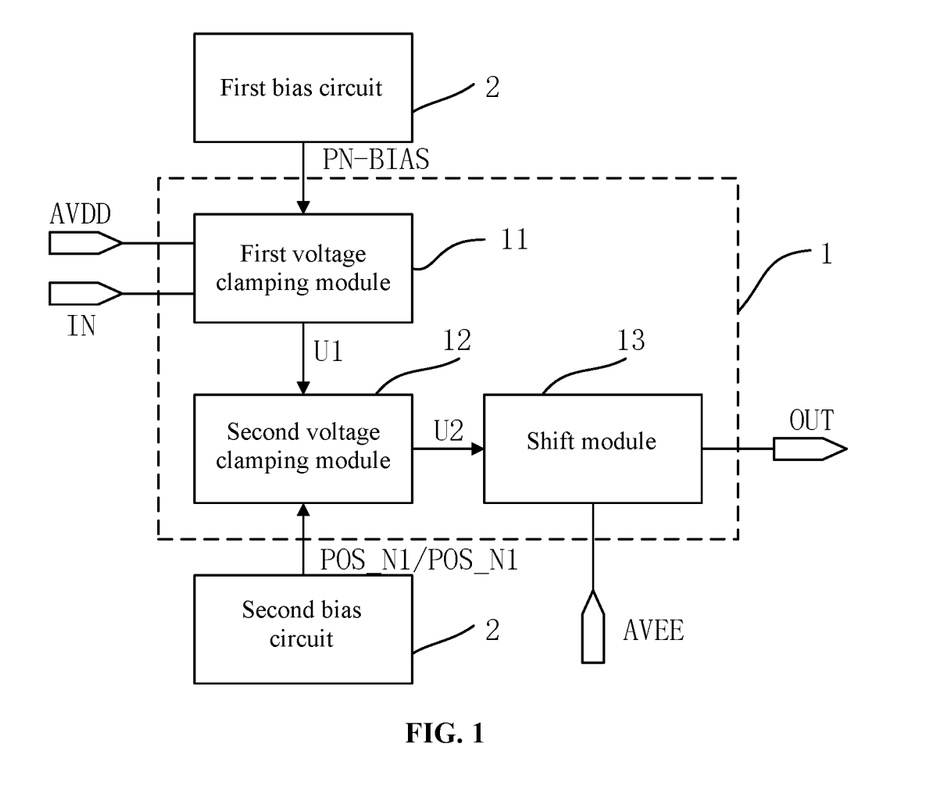
FIG. 1 is a schematic structure diagram of a level shift circuit according to an embodiment of the present disclosure.

FIG. 1 shows a schematic structure diagram of a level shift circuit according to an embodiment of the present disclosure.

The embodiment provides a level shift circuit. As shown in FIG. 1, the level shift circuit 1 includes a first voltage clamping module 11, a second voltage clamping module 12 and a shift module 13.

The first voltage clamping module 11 is configured to generate a first clamping voltage according to an input signal and a first power supply voltage AVDD and adjust the first clamping voltage according to a bias voltage PN_BIAS so that the adjusted first clamping voltage U1 is in a first range, and the absolute value of the difference between the maximum value and the minimum value of the first range is ΔU1.

The second voltage clamping module 12 is configured to adjust the adjusted first clamping voltage U1 to obtain a second clamping voltage U2 according to a first bias voltage POS_N1 and a second bias voltage NEG_P1, the second clamping voltage U2 is in a second range, and the absolute value of the difference between the maximum value and the minimum value of the second range is ΔU2.

The shift module 13 is configured to generate an output signal OUT according to a second power supply voltage AVEE and the second clamping voltage U2, the voltage of the output signal OUT is in a third range, the absolute value of the difference between the maximum value and the minimum value of the third range is ΔU3, and the absolute value of the difference between the first power supply voltage and the second power supply voltage is ΔU.

Each of the first range ΔU1, the second range ΔU2 and the third range ΔU3 is between the first power supply voltage AVDD and the second power supply voltage AVEE, and ΔU1≤½ΔU, ΔU2≤½ΔU, ΔU3≤½ΔU.

For example, in a specific embodiment, the first power supply voltage AVDD is 6V, and the second power supply voltage AVEE is −6V. The adjusted first range may be controlled to be 0V to 6V by adjusting the bias voltage PN_BIAS, and the second range may be controlled to be −3V to 3V by adjusting the first bias voltage POS_N1 and the second bias voltage NEG_P1, so that the third range is −6V to 0V. Of course, this is just exemplary, and during the specific implementation, adjustments may be made according to various level shift circuits.

The embodiment provides the level shift circuit 1, in which by setting the first voltage clamping module 11 and the second voltage clamping module 12, and by adjusting the first clamping voltage by controlling the bias voltage input to the first voltage clamping module 11 and adjusting the second clamping voltage U2 by controlling the bias voltage POS_N1 and the second bias voltage NEG_P1 input to the second voltage clamping module 12, the respective operating and output voltages of the first voltage clamping module 11, the second voltage clamping module 12 and the shift module 13 are within a small range. Therefore, even the level shift circuit is designed by using devices with a breakdown voltage lower than the difference between the first power supply voltage and the second power supply voltage, the devices in the level shift circuit may be avoid being breakdown. Accordingly, some process platforms that cannot produce high-breakdown voltage devices may produce chips including the level shift circuit 1 in the embodiment, and the restrictions on the process platform are reduced.

The level shift circuit 1 provided in the embodiment is suitable for a circuit in which the first power supply voltage AVDD, the second power supply voltage AVEE and the input signal have the following characteristics:

Specifically, the positive and negative polarities of the first power supply voltage AVDD and the second power supply voltage AVEE are opposite, and the absolute value of the difference between the first power supply voltage AVDD and a reference voltage is equal to the absolute value of the difference between the second power supply voltage AVEE and the reference voltage. For example, the first power supply voltage AVDD is +6V, the second power supply voltage AVEE is −6V, and the reference voltage is 0V.

Specifically, the input signal includes a first input signal IN and a second input signal INB each of which is a pulse signal, the first input signal IN and the second input signal INB are inverted, and an amplitude of the first input signal IN is less than or equal to the absolute value of the difference between the first power supply voltage AVDD and the reference voltage. For example, the amplitudes of the first input signal IN and second input signal INB are both 6V, the high level of the first input signal IN and second input signal INB is 6V and the low level thereof is 0V, and the first input signal IN and the second input signal INB are inverted. That is, when the first input signal IN is at a high level, the second input signal INB is at a low level, and when the first input signal IN is at a low level, the second input signal INB is at a high level.

Figure 2:
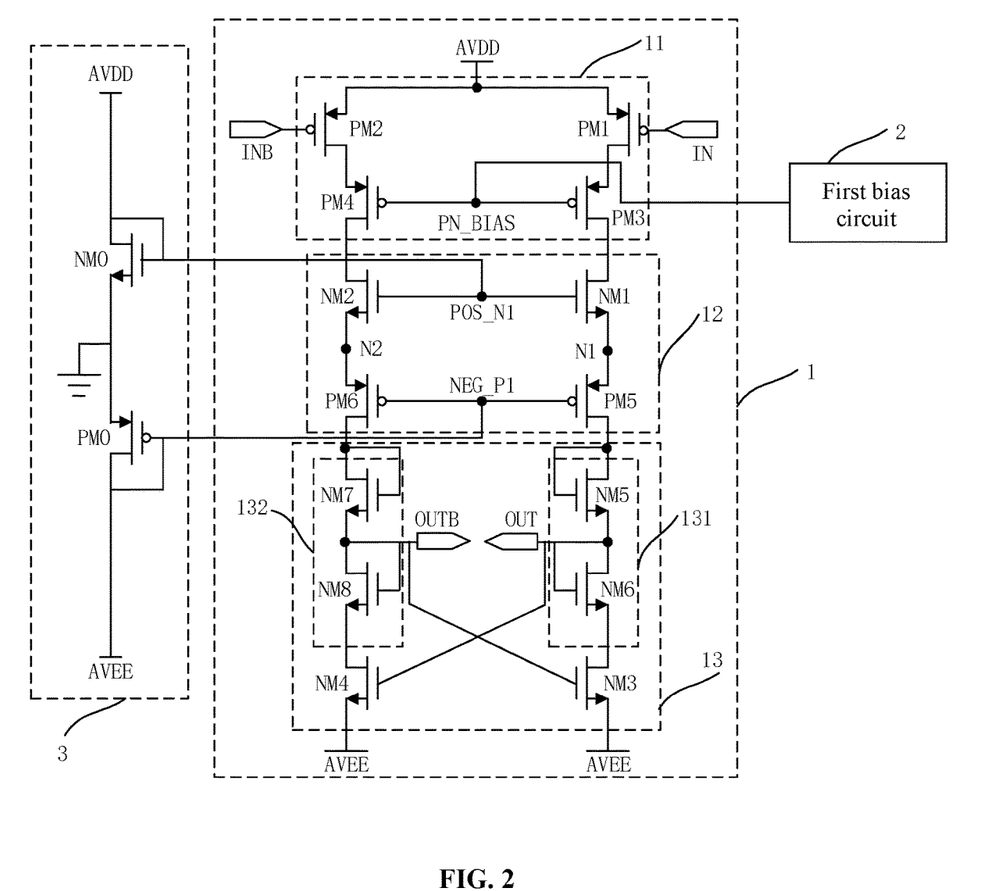
FIG. 2 is a specific circuit diagram of a level shift circuit according to an embodiment of the present disclosure.

FIG. 2 shows a specific circuit diagram of a level shift circuit according to an embodiment of the present disclosure. As shown in FIG. 2, in the level shift circuit 1 provided in the embodiment, the first voltage clamping module 11 includes a first P-type MOS transistor PM1, a second P-type MOS transistor PM2, a third P-type MOS transistor PM3, and a four P-type MOS transistors PM4.

As shown in FIG. 2, each of a source of the first P-type MOS transistor PM1 and a source of the second P-type MOS transistor PM2 is electrically connected to the first power supply terminal AVDD for outputting the first power supply voltage AVDD. A gate of the first P-type MOS transistor PM1 is electrically connected to a first input terminal IN, and a gate of the second P-type MOS transistor PM2 is electrically connected to a second input terminal INB, wherein the first input signal IN is input to the first input terminal IN and the second input signal INB is input to the second input terminal INB; a drain of the first P-type MOS transistor PM1 is electrically connected to a source of the third P-type MOS transistor PM3, and a drain of the second P-type MOS transistor PM2 is electrically connected to a source of the fourth P-type MOS transistor PM4; each of a gate of the third P-type MOS transistor PM3 and a gate of the fourth P-type MOS transistor PM2 is electrically connected to a first bias circuit 2 for outputting the bias voltage PN_BIAS; and a drain of the third P-type MOS transistor PM3 and a drain of the fourth P-type MOS transistor PM4 are used to output the adjusted first clamping voltage U1.

Specifically, as shown in FIG. 2, due to the inversion of the first input signal IN and the second input signal INB, the first P-type MOS transistor PM1 and the second P-type MOS transistor PM2 are not turned on at the same time. In the embodiment, the first clamping voltage is a drain voltage of the first P-type MOS transistor PM1 or a drain voltage of the second P-type MOS transistor PM2. Due to the input of the bias voltage PN_BIAS, the drain voltage Vd (PM1) of the first P-type MOS transistor PM1 and the drain voltage Vd (PM2) of the second P-type MOS transistor PM2 are both controlled by the bias voltage Vd (PN_BIAS).

Specifically, as shown in FIG. 2, when the level shift circuit 1 is in operation, Vth(PM3)=Vg(PM3)−Vs(PM3). Since the drain of the first P-type MOS transistor PM1 is electrically connected to the source of the third P-type MOS transistor, Vd(PM1)=Vg(PM3)−Vth(PM3). On this basis, the voltage difference between the source and drain of the first P-type MOS transistor PM1 is: Vds(PM1)=Vd(PM1)−Vs(PM1)=Vg(PM3)−Vth(PM3)−AVDD, where Vg(PM3) is the bias voltage PN_BIAS. Thus, Vds(PM1)=V(PN_BIAS)−Vth(PM3)−AVDD.

Similarly, Vds(PM2)=V(PN_BIAS)−Vth(PM4)−AVDD.

It may be determined from the above relationship that the drain voltage Vd (PM1) of the first P-type MOS transistor PM1 and the drain voltage Vd (PM2) of the second P-type MOS transistor PM2 may be adjusted by adjusting the value of the bias voltage PN_BIAS. That is, a source-drain voltage of the first P-type MOS transistor PM1 and a source-drain voltage of the second P-type MOS transistor PM2 are adjusted respectively. In specific implementation, the source-drain voltage of the first P-type MOS transistor PM1 and the source-drain voltage of the second P-type MOS transistor PM2 may be kept at the maximum value by adjusting the value of the bias voltage PN_BIAS, so that the devices in the second voltage clamping module 12 are at lower potentials.

As shown in FIG. 2, in the level shift circuit 1 provided in the embodiment, the second voltage clamping module 12 includes a first N-type MOS transistor NM1, a second N-type MOS transistor NM2, a fifth P-type MOS transistor PM5 and a sixth P-type MOS transistor PM6. Each of a gate of the first N-type MOS transistor NM1 and a gate of the second N-type MOS transistor NM2 is electrically connected to a first bias voltage terminal of a second bias circuit 3 for outputting the first bias voltage POS_N1, and each of a gate of the fifth P-type MOS transistor PM5 and a gate of the sixth P-type MOS transistor PM6 is electrically connected to a second bias voltage terminal of the second bias circuit 3 for outputting the second bias voltage NEG_P1; a drain of the first N-type MOS transistor NM1 is electrically connected to the drain of the third P-type MOS transistor PM3, and a source of the first N-type MOS transistor NM1 is electrically connected to a source of the fifth P-type MOS transistor PM5; a drain of the second N-type MOS transistor NM2 is electrically connected to the drain of the fourth P-type MOS transistor PM4, and a source of the second N-type MOS transistor NM2 is electrically connected to a source of the sixth P-type MOS transistor PM6; and a drain of the fifth P-type MOS transistor PM5 and a drain of the sixth P-type MOS transistor PM6 are used to output the second clamping voltage.

Specifically, as shown in FIG. 2, the source of the first N-type MOS transistor NM1 and the source of the fifth P-type MOS transistor PM5 are used as a first node N1, and the source of the second N-type MOS transistor NM2 and the source of the six P-type MOS transistor PM6 are used as a second node N2.

Each of a voltage of the first node N1 and a voltage of the second node N2 is between the adjusted first clamping voltage and the second clamping voltage.

Specifically, as shown in FIG. 2, the voltage V(N1) of the first node N1 is between a source voltage of the first N-type MOS transistor NM1 and a drain voltage of the fifth P-type MOS transistor PM5, and the voltage V(N2) of the second node N2 is between a drain voltage of the second N-type MOS transistor NM2 and a drain voltage of the sixth P-type MOS transistor PM6.

Therefore, the ranges of the voltage V(N1) of the first node N1 and the voltage V(N2) of the second node N2 are:

$$V(NEG\_P1)+Vth(PM5) \leq V(N1) \leq V(POS\_N1)-Vth(NM1);$$

$$V(NEG\_P1)+Vth(PM6) \leq V(N2) \leq V(POS\_N1)-Vth(NM2)$$

Therefore, the ranges of the first node N1 and the second node N2 may be adjusted by adjusting the first bias voltage POS_N1 and the second bias voltage NEG_P1. If the voltage between the source and the drain of the MOS transistor being turned on is ignored, the source potential of the first N-type MOS transistor NM1 is similar to the drain potential of the first P-type MOS transistor NM1, and the source potential of the second N-type MOS transistor NM2 is similar to the drain potential of the second P-type MOS transistor PM2. Therefore, the potentials of the first node N1 and the second node N2 may also be adjusted by adjusting the range of the bias voltage, so that the first node N1 and the second node N2 are at a lower potential to ensure that the range of the operating voltage of the shift module 13 does not exceed the breakdown voltage of the device, thereby ensuring the safety of the circuit.

As shown in FIG. 2, in the level shift circuit 1 provided in the embodiment, the shift module 13 includes a first shift unit 131, a second shift unit 132, a third N-type MOS transistor NM3 and a fourth N-type MOS transistor NM4. The output signal includes a first output signal and a second output signal.

Specifically, as shown in FIG. 2, the first shift unit 131 is respectively electrically connected to the drain of the fifth P-type MOS transistor PM5 and a gate of the fourth N-type MOS transistor NM4, and is configured to generate the first output signal OUT according to the received second output signal and the second power supply voltage AVEE.

Specifically, as shown in FIG. 2, the second shift unit 132 is respectively electrically connected to the drain of the sixth P-type MOS transistor PM6 and a gate of the third N-type MOS transistor NM3, and is configured to generate the second output signal OUTB according to the received first output signal and the second power supply voltage AVEE.

Specifically, as shown in FIG. 2, the first shift unit 131 includes a fifth N-type MOS transistor NM5 and a sixth N-type MOS transistor NM6, each of a gate and a drain of the fifth N-type MOS transistor NM5 is electrically connected to the drain of the fifth P-type MOS transistor PM5, a source of the fifth N-type MOS transistor NM5 is respectively electrically connected to a gate and a drain of the sixth N-type MOS transistor NM6, the gate of the sixth N-type MOS transistor NM6 is also respectively electrically connected to the first output terminal OUT and the second power supply terminal AVEE, and a source of the sixth N-type MOS transistor NM6 is also electrically connected to the second power supply terminal AVEE.

Specifically, as shown in FIG. 2, the second shift unit 132 includes a seventh N-type MOS transistor NM7 and an eighth N-type MOS transistor NM8, each of a gate and a drain of the seventh N-type MOS transistor NM7 is electrically connected to the drain of the sixth P-type MOS transistor PM6, a source of the seventh N-type MOS transistor NM7 is respectively electrically connected to a gate and a drain of the eighth N-type MOS transistor NM8, the gate of the eighth N-type MOS transistor NM8 is also respectively electrically connected to the second output terminal OUTB and the second power supply terminal AVEE, and a source of the eighth N-type MOS transistor NM8 is also electrically connected to the second power supply terminal AVEE.

Figure 3:
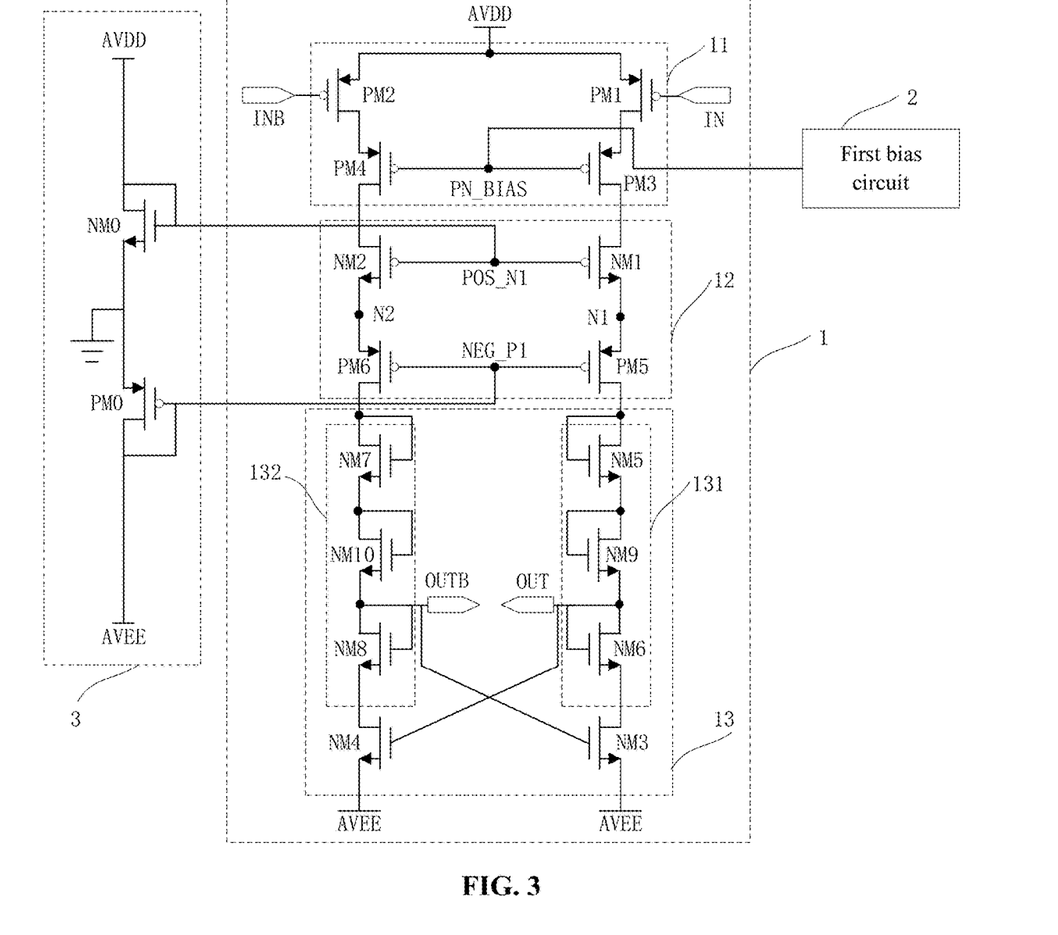
FIG. 3 is a specific circuit diagram of another level shift circuit according to an embodiment of the present disclosure.

FIG. 3 is a specific circuit diagram of another level shift circuit 1 according to an embodiment of the present disclosure. As shown in FIG. 3, the first shift unit 131 further includes a ninth N-type MOS transistor NM9, each of a gate and a drain of the ninth N-type MOS transistor NM9 is electrically connected to the source of the fifth N-type MOS transistor, and a source of the ninth N-type MOS transistor NM9 is respectively electrically connected to the gate and the drain of the sixth N-type MOS transistor NM6.

As shown in FIG. 3, the second shift unit 132 further includes a tenth N-type MOS transistor NM10, each of a gate and a drain of the tenth N-type MOS transistor NM10 is electrically connected to the source of the seventh N-type MOS transistor NM7, and a source of the tenth N-type MOS transistor NM10 is respectively electrically connected to the gate and the drain of the eighth N-type MOS transistor NM8.

As shown in FIGS. 2 and 3, only the structure of the second bias circuit 3 is shown. The second bias circuit 3 includes an N-type MOS transistor NM0 for biasing and a P-type MOS transistor PM0 for biasing. A gate and a drain of the N-type MOS transistor NM0 for biasing are both electrically connected to the power supply voltage AVDD. A drain and a gate of the P-type MOS transistor PM0 for biasing are both electrically connected to the second power supply voltage AVEE. A source of the N-type MOS transistor NM0 for biasing and a source of the P-type MOS transistor PM0 for biasing are both grounded. The gate voltage of the N-type MOS transistor NM0 for biasing is the first bias voltage POS_N1, and the gate voltage of the P-type MOS transistor PM0 for biasing is the second bias voltage NEG_P1.

Figure 4:
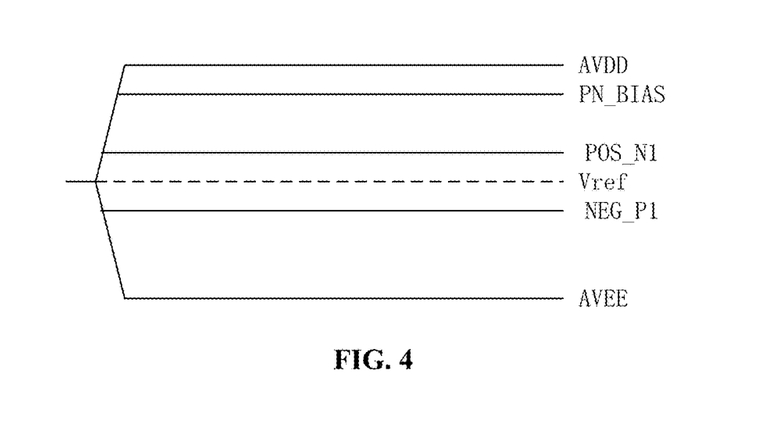
FIG. 4 is a timing diagram of a power supply voltage and bias voltages according to an embodiment of the present disclosure.
Figure 5:
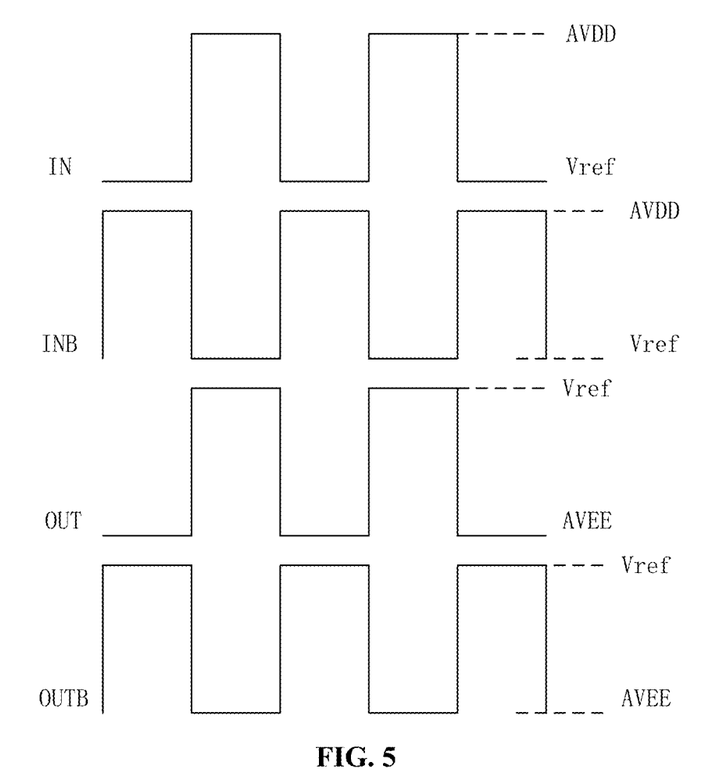
FIG. 5 is a timing diagram of an input signal and an output signal according to an embodiment of the present disclosure.

It should be noted that, although the first bias circuit 2 is not shown, each of the first bias circuit 2 and the second bias circuit 3 may be adjusted according to practical applications. FIG. 4 is a timing diagram of a power supply voltage and bias voltages according to an embodiment of the present disclosure. FIG. 5 is a timing diagram of an input signal and an output signal according to an embodiment of the present disclosure.

In order to facilitate the understanding of the technical solutions of the present disclosure, the operating principle of the level shift circuit 1 provided in the embodiment will be described below with reference to the level shift circuit 1 shown in FIG. 3 and the timing diagrams shown in FIGS. 4 and 5.

In the level shift circuit 1 shown in FIG. 3, the fourth P-type MOS transistor PM4 and the third P-type MOS transistor PM3 are controlled by the bias voltage PN_BIAS, the first N-type MOS transistor NM1 and the second N-type MOS transistor NM2 are controlled by the first bias voltage POS_N1, and the fifth P-type MOS transistor PM5 and the sixth P-type MOS transistor PM6 are controlled by the second bias voltage NEG_P1. Therefore, it is possible to ensure that the fourth P-type MOS transistor PM4 and the third P-type MOS transistor PM3 are in ON state by adjusting the bias voltage PN_BIAS; it is possible to ensure that the first N-type MOS transistor NM1 and the second N-type MOS transistor NM2 are in the ON state by controlling the first bias voltage POS_N1; and it is possible to ensure that the fifth P-type MOS transistor PM5 and the sixth P-type MOS transistor PM6 are in the ON state by controlling the second bias voltage NEG_P1.

As shown in FIGS. 3-5, when the first input signal IN is at a high level, the first P-type MOS transistor PM1 is turned off, and at this time, the second input signal INB inverted to the first input signal IN is at a low level so that the second P-type MOS transistor PM2 is turned on. Thus, the adjusted first clamping voltage is input to the fifth N-type MOS transistor NM5 after being adjusted by the first bias voltage POS_N1 and the second bias voltage NEG_P1, so that the fifth N-type MOS transistor NM5, the ninth N-type MOS transistor NM9 and the sixth N-type MOS transistor NM6 are turned on and the first output signal output by the first output terminal OUT is controlled to be just the reference voltage Vref; and meanwhile, the reference voltage Vref is input to the gate of the fourth N-type MOS transistor NM4 so that the fourth N-type MOS transistor NM4 is turned on, and therefore the second output signal output by the second output terminal OUTB is at a low level AVEE.

Similarly, when the first input signal IN is at a low level and the second input signal INB inverted to the first input signal IN is at a high level, the first output signal output by the first output terminal OUT is at the low level AVEE and the second output signal output by the second output terminal OUTB is just the reference voltage Vref.

By adjusting the values of the first bias voltage POS_N1 and the second bias voltage NEG_P1, a value of a signal output by the corresponding output terminal may be controlled. The analysis is as follows: By respectively providing three N-type MOS transistors in the first shift unit and the second shift unit at the front of the third N-type MOS transistor NM3 and the fourth N-type MOS transistor NM4, the maximum voltage ranges at the first output terminal OUT1 and the second output terminal OUT2 may be limited. If parameters of the three N-type MOS transistors in the first shift unit and the second shift unit are consistent, the voltage ranges of the first output signal OUT1 and the second output signal OUT2 are as follows:

$$Vth(NM4) < V(OUT) < V(POS\_N1) - 3Vth(NM7);$$

$$Vth(NM3) \leq V(OUTB) < V(POS\_N1) - 3Vth(NM5).$$

That is, the values of the first bias voltage POS_N1 and the second bias voltage POS_N1 may be determined through the above formulae, so as to obtain the value of the signal output by the corresponding output terminal.

In a specific embodiment, the first power supply voltage AVDD is 6V, the second power supply voltage AVEE is −6V, the high level of the first input signal IN and the second input signal INB is 6V and the low level thereof is 0V. The high level of the first output signal OUT and the second output signal OUTB is 0V, and the low level thereof is −6V.

Figure 6:
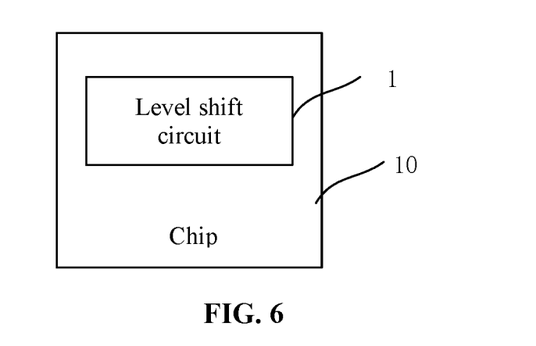
FIG. 6 is a schematic structure diagram of the architecture of a chip according to an embodiment of the present disclosure.

Based on the same inventive concept, a chip is provided according to an embodiment of the present disclosure. As shown in FIG. 6, the chip 10 includes the level shift circuit 1 in any of the above embodiments, and has the beneficial effects of the level shift circuit 1 in the above embodiments, which will not be repeated here.

Figure 7:
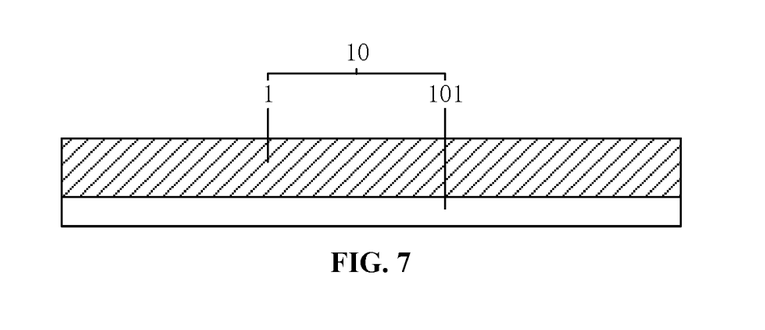
FIG. 7 is a schematic cross-section view of a chip according to an embodiment of the present disclosure.

Specifically, as shown in FIG. 7, the chip 10 provided in the embodiment further includes a substrate 101 on which the level shift circuit 1 is fabricated.

Figure 8:
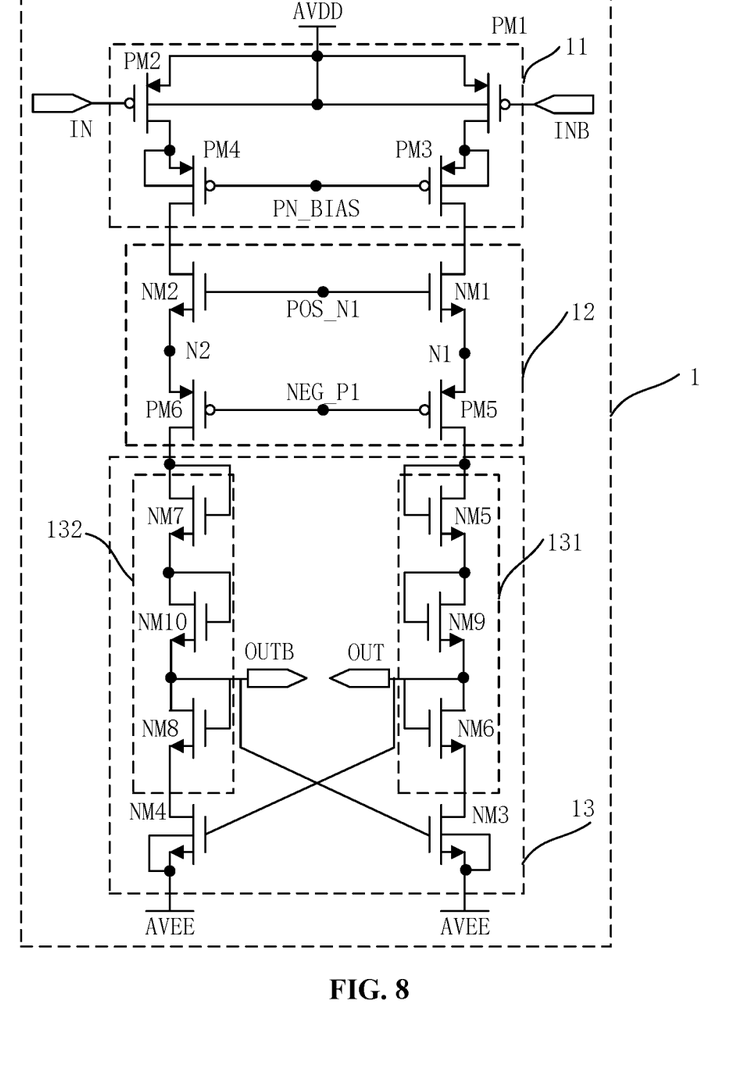
FIG. 8 is a specific circuit diagram of still another level shift circuit according to an embodiment of the present disclosure.

Specifically, as shown in FIG. 8, substrate voltages of the first P-type MOS transistor PM1 and second P-type MOS transistor PM2 in the first voltage clamping module 11 are equal to the first power supply voltage AVDD, that is, a positive voltage is provided to the P-type MOS transistors. And, a substrate voltage of the third P-type MOS transistor PM3 is equal to the drain voltage of the first P-type MOS transistor PM1, and a substrate voltage of the fourth P-type MOS transistor PM4 is equal to the drain voltage of the second P-type MOS transistor PM2. A voltage of the substrate 101, on which the third N-type MOS transistor NM3 and the fourth N-type MOS transistor NM4 in the shift module 13 are fabricated, is the second power supply voltage AVEE, that is, a negative voltage is provided to the N-type MOS transistors. Accordingly, the bias effect of the level shift circuit 1 may be improved.

Figure 9:
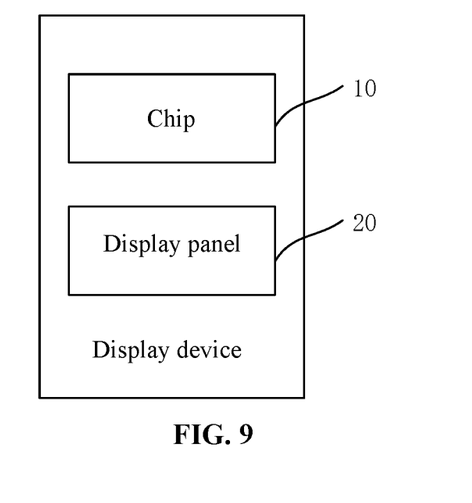
FIG. 9 is a schematic diagram of the architecture of a display device according to an embodiment of the present disclosure.

Based on the same inventive concept, a display device is provided according to an embodiment of the present disclosure. As shown in FIG. 9, the display device includes the chip 10 in the above embodiments, and has the beneficial effects of the chip 10 in the above embodiments, which will not be repeated here.

Specifically, as shown in FIG. 9, the display device further includes a display panel 20 that is electrically connected to the chip 10.

Specifically, the display device provided in the embodiment may be a mobile display device such as a mobile phone and a tablet computer etc. or a display device such as a notebook computer and a TV etc. For the medium and large display device such as the notebook computer and the TV etc., since the required driving voltage is relatively high, the use of the chip 10 has more obvious advantages.

The application of the embodiments of the present disclosure at least has the following beneficial effects.

The embodiments provide a level shift circuit, a driver chip, and a display device, in which by setting the first voltage clamping module and the second voltage clamping module, and by adjusting the first clamping voltage by controlling the bias voltage input to the first voltage clamping module and adjusting the second clamping voltage by controlling the first bias voltage and the second bias voltage input to the second voltage clamping module, the respective operating and output voltages of the first voltage clamping module, the second voltage clamping module and the shift module are within a small range. Therefore, even the level shift circuit is designed by using devices with a breakdown voltage lower than the difference between the first power supply voltage and the second power supply voltage, the devices in the level shift circuit may be avoid being breakdown. Accordingly, some process platforms that cannot produce high-breakdown voltage devices may produce chips including the level shift circuit in the embodiments, and the restrictions on the process platform are reduced.

The terms "first" and "second" are simply used for the purpose of description, and should not be regarded as indicating or implying relative importance or implicitly indicating the number of indicated technical features. Therefore, the features defined as "first" and "second" may explicitly or implicitly include one or more of the features. In the description of the present disclosure, unless specifically stated otherwise, "a plurality of" means "two" or "more than two".

The foregoing descriptions are merely some implementations of the present disclosure. It should be noted that, to those of ordinary skill in the art, various improvements and modifications may be made without departing from the principle of the present disclosure, and these improvements and modifications shall be deemed as falling into the protection scope of the present disclosure.

What is claimed is:

1. A level shift circuit, comprising:
a first voltage clamping module configured to generate a first clamping voltage according to an input signal and a first power supply voltage and adjust the first clamping voltage according to a bias voltage so that the adjusted first clamping voltage is in a first range, an absolute value of a difference between the maximum value and the minimum value of the first range being $\Delta U1$;
a second voltage clamping module configured to adjust the adjusted first clamping voltage according to a first bias voltage and a second bias voltage to obtain a second clamping voltage, the second clamping voltage being in a second range, an absolute value of a difference between the maximum value and the minimum value of the second range being $\Delta U2$; and
a shift module configured to generate an output signal according to a second power supply voltage and the second clamping voltage, a voltage of the output signal being in a third range, and an absolute value of a difference between the maximum value and the minimum value of the third range being $\Delta U3$, an absolute value of a difference between the first power supply voltage and the second power supply voltage being $\Delta U$;
wherein, each of the first range, the second range and the third range is between the first power supply voltage and the second power supply voltage, and $\Delta U1 \leq \frac{1}{2}\Delta U$, $\Delta U2 \leq \frac{1}{2}\Delta U$, $\Delta U3 \leq \frac{1}{2}\Delta U$; wherein,
the first voltage clamping module comprises a first P-type MOS transistor, a second P-type MOS transistor, a third P-type MOS transistor and a fourth P-type MOS transistor;
the second voltage clamping module comprises a first N-type MOS transistor, a second N-type MOS transistor, a fifth P-type MOS transistor and a sixth P-type MOS transistor;
the shift module comprises a first shift unit, a second shift unit, a third N-type MOS transistor and a fourth N-type MOS transistor, and the output signal comprises a first output signal and a second output signal, wherein,
the first shift unit is respectively electrically connected to the drain of the fifth P-type MOS transistor and a gate of the fourth N-type MOS transistor, and is configured to generate the first output signal according to the received second output signal and the second power supply voltage; and the second shift unit is respectively electrically connected to the drain of the sixth P-type MOS transistor and a gate of the third N-type MOS transistor, and is configured to generate the second output signal according to the received first output signal and the second power supply voltage.

2. The level shift circuit according to claim 1, wherein positive and negative polarities of the first power supply voltage and the second power supply voltage are opposite, and an absolute value of a difference between the first power supply voltage and a reference voltage is equal to an absolute value of a difference between the second power supply voltage and the reference voltage; and the input signal comprises a first input signal and a second input signal each of which is a pulse signal, the first input signal and the second input signal are inverted, and an amplitude of the first input signal is less than or equal to the absolute value of the difference between the first power supply voltage and the reference voltage.

3. The level shift circuit according to claim 2, wherein each of a source of the first P-type MOS transistor and a source of the second P-type MOS transistor is electrically connected to a first power supply terminal for outputting the first power supply voltage;

a gate of the first P-type MOS transistor is electrically connected to a first input terminal, and a gate of the second P-type MOS transistor is electrically connected to a second input terminal, wherein the first input signal is input to the first input terminal and the second input signal is input to the second input terminal;

a drain of the first P-type MOS transistor is electrically connected to a source of the third P-type MOS transistor, and a drain of the second P-type MOS transistor is electrically connected to a source of the fourth P-type MOS transistor;

each of a gate of the third P-type MOS transistor and a gate of the fourth P-type MOS transistor is electrically connected to a first bias circuit for outputting the bias voltage; and a drain of the third P-type MOS transistor and a drain of the fourth P-type MOS transistor are used to output the adjusted first clamping voltage.

4. The level shift circuit according to claim 3, wherein each of a gate of the first N-type MOS transistor and a gate of the second N-type MOS transistor is electrically connected to a first bias voltage terminal of a second bias circuit outputting the first bias voltage, and each of a gate of the fifth P-type MOS transistor and a gate of the sixth P-type MOS transistor is electrically connected to a second bias terminal of the second bias circuit outputting the second bias;

a drain of the first N-type MOS transistor is electrically connected to the drain of the third P-type MOS transistor, and a source of the first N-type MOS transistor is electrically connected to a source of the fifth P-type MOS transistor;

a drain of the second N-type MOS transistor is electrically connected to the drain of the fourth P-type MOS transistor, and a source of the second N-type MOS transistor is electrically connected to a source of the sixth P-type MOS transistor; and a drain of the fifth P-type MOS transistor and a drain of the sixth P-type MOS transistor are used to output the second clamping voltage.

5. The level shift circuit according to claim 1, wherein the first shift unit comprises a fifth N-type MOS transistor and a sixth N-type MOS transistor, each of a gate and a drain of the fifth N-type MOS transistor is electrically connected to the drain of the fifth P-type MOS transistor, a source of the fifth N-type MOS transistor is respectively electrically connected to a gate and a drain of the sixth N-type MOS transistor, the gate of the sixth N-type MOS transistor is also respectively electrically connected to a first output terminal for outputting the first output signal and a second power supply terminal for outputting the second power supply voltage, and a source of the sixth N-type MOS transistor is also electrically connected to the second power supply terminal.

6. The level shift circuit according to claim 1, wherein the second shift unit comprises a seventh N-type MOS transistor and an eighth N-type MOS transistor, each of a gate and a drain of the seventh N-type MOS transistor is electrically connected to the drain of the sixth P-type MOS transistor, a source of the seventh N-type MOS transistor is respectively electrically connected to a gate and a drain of the eighth N-type MOS transistor, the gate of the eighth N-type MOS transistor is also respectively electrically connected to a second output terminal for outputting the second output signal and a second power supply terminal for outputting the second power supply voltage, and a source of the eighth N-type MOS transistor is also electrically connected to the second power supply terminal.

7. The level shift circuit according to claim 5, wherein the first shift unit further comprises a ninth N-type MOS transistor, each of a gate and a drain of the ninth N-type MOS transistor is electrically connected to the source of the fifth N-type MOS transistor, and a source of the ninth N-type MOS transistor is respectively electrically connected to the gate and the drain of the sixth N-type MOS transistor.

8. The level shift circuit according to claim 6, wherein the second shift unit further comprises a tenth N-type MOS transistor, each of a gate and a drain of the tenth N-type MOS transistor is electrically connected to the source of the seventh N-type MOS transistor, and a source of the tenth N-type MOS transistor is respectively electrically connected to the gate and the drain of the eighth N-type MOS transistor.

9. A chip, comprising a level shift circuit, and the level shift circuit comprising:

a first voltage clamping module configured to generate a first clamping voltage according to an input signal and a first power supply voltage and adjust the first clamping voltage according to a bias voltage so that the adjusted first clamping voltage is in a first range, an absolute value of a difference between the maximum value and the minimum value of the first range being $\Delta U1$;

a second voltage clamping module configured to adjust the adjusted first clamping voltage according to a first bias voltage and a second bias voltage to obtain a second clamping voltage, the second clamping voltage being in a second range, an absolute value of a difference between the maximum value and the minimum value of the second range being $\Delta U2$; and a shift module configured to generate an output signal according to a second power supply voltage and the second clamping voltage, a voltage of the output signal being in a third range, and an absolute value of a difference between the maximum value and the minimum value of the third range being ΔU3, an absolute value of a difference between the first power supply voltage and the second power supply voltage being ΔU; wherein, each of the first range, the second range and the third range is between the first power supply voltage and the second power supply voltage, and ΔU1≤½ΔU, ΔU2≤½ΔU, ΔU3≤½ΔU; wherein, the first voltage clamping module comprises a first P-type MOS transistor, a second P-type MOS transistor, a third P-type MOS transistor and a fourth P-type MOS transistor;

the second voltage clamping module comprises a first N-type MOS transistor, a second N-type MOS transistor, a fifth P-type MOS transistor and a sixth P-type MOS transistor;

the shift module comprises a first shift unit, a second shift unit, a third N-type MOS transistor and a fourth N-type MOS transistor, and the output signal comprises a first output signal and a second output signal, wherein, the first shift unit is respectively electrically connected to the drain of the fifth P-type MOS transistor and a gate of the fourth N-type MOS transistor, and is configured to generate the first output signal according to the received second output signal and the second power supply voltage; and the second shift unit is respectively electrically connected to the drain of the sixth P-type MOS transistor and a gate of the third N-type MOS transistor, and is configured to generate the second output signal according to the received first output signal and the second power supply voltage.

10. The chip according to claim 9, wherein positive and negative polarities of the first power supply voltage and the second power supply voltage are opposite, and an absolute value of a difference between the first power supply voltage and a reference voltage is equal to an absolute value of a difference between the second power supply voltage and the reference voltage; and the input signal comprises a first input signal and a second input signal each of which is a pulse signal, the first input signal and the second input signal are inverted, and an amplitude of the first input signal is less than or equal to the absolute value of the difference between the first power supply voltage and the reference voltage.

11. The chip according to claim 10, wherein each of a source of the first P-type MOS transistor and a source of the second P-type MOS transistor is electrically connected to a first power supply terminal for outputting the first power supply voltage;

a gate of the first P-type MOS transistor is electrically connected to a first input terminal, and a gate of the second P-type MOS transistor is electrically connected to a second input terminal, wherein the first input signal is input to the first input terminal and the second input signal is input to the second input terminal;

a drain of the first P-type MOS transistor is electrically connected to a source of the third P-type MOS transistor, and a drain of the second P-type MOS transistor is electrically connected to a source of the fourth P-type MOS transistor;

each of a gate of the third P-type MOS transistor and a gate of the fourth P-type MOS transistor is electrically connected to a first bias circuit for outputting the bias voltage; and a drain of the third P-type MOS transistor and a drain of the fourth P-type MOS transistor are used to output the adjusted first clamping voltage.

12. The chip according to claim 11, wherein each of a gate of the first N-type MOS transistor and a gate of the second N-type MOS transistor is electrically connected to a first bias voltage terminal of a second bias circuit outputting the first bias voltage, and each of a gate of the fifth P-type MOS transistor and a gate of the sixth P-type MOS transistor is electrically connected to a second bias terminal of the second bias circuit outputting the second bias;

a drain of the first N-type MOS transistor is electrically connected to the drain of the third P-type MOS transistor, and a source of the first N-type MOS transistor is electrically connected to a source of the fifth P-type MOS transistor;

a drain of the second N-type MOS transistor is electrically connected to the drain of the fourth P-type MOS transistor, and a source of the second N-type MOS transistor is electrically connected to a source of the sixth P-type MOS transistor; and a drain of the fifth P-type MOS transistor and a drain of the sixth P-type MOS transistor are used to output the second clamping voltage.

13. The chip according to claim 9, wherein the first shift unit comprises a fifth N-type MOS transistor and a sixth N-type MOS transistor, each of a gate and a drain of the fifth N-type MOS transistor is electrically connected to the drain of the fifth P-type MOS transistor, a source of the fifth N-type MOS transistor is respectively electrically connected to a gate and a drain of the sixth N-type MOS transistor, the gate of the sixth N-type MOS transistor is also respectively electrically connected to a first output terminal for outputting the first output signal and a second power supply terminal for outputting the second power supply voltage, and a source of the sixth N-type MOS transistor is also electrically connected to the second power supply terminal.

14. The chip according to claim 9, wherein the second shift unit comprises a seventh N-type MOS transistor and an eighth N-type MOS transistor, each of a gate and a drain of the seventh N-type MOS transistor is electrically connected to the drain of the sixth P-type MOS transistor, a source of the seventh N-type MOS transistor is respectively electrically connected to a gate and a drain of the eighth N-type MOS transistor, the gate of the eighth N-type MOS transistor is also respectively electrically connected to a second output terminal for outputting the second output signal and a second power supply terminal for outputting the second power supply voltage, and a source of the eighth N-type MOS transistor is also electrically connected to the second power supply terminal.

15. The chip according to claim 13, wherein the first shift unit further comprises a ninth N-type MOS transistor, each of a gate and a drain of the ninth N-type MOS transistor is electrically connected to the source of the fifth N-type MOS transistor, and a source of the ninth N-type MOS transistor is respectively electrically connected to the gate and the drain of the sixth N-type MOS transistor.

16. The chip according to claim 14, wherein the second shift unit further comprises a tenth N-type MOS transistor, each of a gate and a drain of the tenth N-type MOS transistor is electrically connected to the source of the seventh N-type MOS transistor, and a source of the tenth N-type MOS transistor is respectively electrically connected to the gate and the drain of the eighth N-type MOS transistor.

17. A display device, comprising the chip, and the chip comprising a level shift circuit, and the level shift circuit comprising:
- a first voltage clamping module configured to generate a first clamping voltage according to an input signal and a first power supply voltage and adjust the first clamping voltage according to a bias voltage so that the adjusted first clamping voltage is in a first range, an absolute value of a difference between the maximum value and the minimum value of the first range being $\Delta U1$;
- a second voltage clamping module configured to adjust the adjusted first clamping voltage according to a first bias voltage and a second bias voltage to obtain a second clamping voltage, the second clamping voltage being in a second range, an absolute value of a difference between the maximum value and the minimum value of the second range being $\Delta U2$; and
- a shift module configured to generate an output signal according to a second power supply voltage and the second clamping voltage, a voltage of the output signal being in a third range, and an absolute value of a difference between the maximum value and the minimum value of the third range being $\Delta U3$, an absolute value of a difference between the first power supply voltage and the second power supply voltage being $\Delta U$;
- wherein, each of the first range, the second range and the third range is between the first power supply voltage and the second power supply voltage, and $\Delta U1 \leq \frac{1}{2}\Delta U$, $\Delta U2 \leq \frac{1}{2}\Delta U$, $\Delta U3 \leq \frac{1}{2}\Delta U$; wherein, the first voltage clamping module comprises a first P-type MOS transistor, a second P-type MOS transistor, a third P-type MOS transistor and a fourth P-type MOS transistor;

the second voltage clamping module comprises a first N-type MOS transistor, a second N-type MOS transistor, a fifth P-type MOS transistor and a sixth P-type MOS transistor;

the shift module comprises a first shift unit, a second shift unit, a third N-type MOS transistor and a fourth N-type MOS transistor, and the output signal comprises a first output signal and a second output signal, wherein, the first shift unit is respectively electrically connected to the drain of the fifth P-type MOS transistor and a gate of the fourth N-type MOS transistor, and is configured to generate the first output signal according to the received second output signal and the second power supply voltage; and the second shift unit is respectively electrically connected to the drain of the sixth P-type MOS transistor and a gate of the third N-type MOS transistor, and is configured to generate the second output signal according to the received first output signal and the second power supply voltage.

18. The display device according to claim 17, wherein
positive and negative polarities of the first power supply voltage and the second power supply voltage are opposite, and an absolute value of a difference between the first power supply voltage and a reference voltage is equal to an absolute value of a difference between the second power supply voltage and the reference voltage; and the input signal comprises a first input signal and a second input signal each of which is a pulse signal, the first input signal and the second input signal are inverted, and an amplitude of the first input signal is less than or equal to the absolute value of the difference between the first power supply voltage and the reference voltage.

* * * * *